(12) United States Patent
Huhler et al.

(10) Patent No.: US 12,402,256 B2
(45) Date of Patent: Aug. 26, 2025

(54) REFLOW SOLDERING MACHINE FOR CONTINUOUSLY SOLDERING OF SOLDERING GOODS

(71) Applicant: ERSA GmbH, Wertheim (DE)

(72) Inventors: Thomas Huhler, Neubrunn (DE); Benedict Fleischmann, Neubrunn (DE); Ruppert Elmar, Mespelbrunn (DE)

(*) Notice: Subject to any disclaimer, the term of this patent is extended or adjusted under 35 U.S.C. 154(b) by 822 days.

(21) Appl. No.: 17/763,454

(22) PCT Filed: Aug. 27, 2020

(86) PCT No.: PCT/EP2020/074018
§ 371 (c)(1),
(2) Date: Mar. 24, 2022

(87) PCT Pub. No.: WO2021/058225
PCT Pub. Date: Apr. 1, 2021

(65) Prior Publication Data
US 2022/0295643 A1    Sep. 15, 2022

(30) Foreign Application Priority Data
Sep. 26, 2019 (DE) .............. 10 2019 125 983.5

(51) Int. Cl.
*H05K 3/34* (2006.01)
*B23K 1/012* (2006.01)

(52) U.S. Cl.
CPC .......... *H05K 3/3494* (2013.01); *B23K 1/012* (2013.01); *H05K 2203/085* (2013.01); *H05K 2203/1545* (2013.01)

(58) Field of Classification Search
CPC .......... H05K 3/3494; H05K 2203/085; H05K 2203/1545; B23K 1/012; B23K 1/0016;
(Continued)

(56) References Cited

U.S. PATENT DOCUMENTS 6,084,214 A * 7/2000 Tallman .............. B23K 1/012
                                                219/400
2009/0014503 A1    1/2009 Choi et al.
(Continued)

FOREIGN PATENT DOCUMENTS

DE    19911887 C1    12/2000
DE    20102064 U1    6/2001
(Continued)

OTHER PUBLICATIONS

German Office Action of German Application 10 2019 125 983.5, pp. 1-3.
(Continued)

*Primary Examiner* — John P. Dulka
(74) *Attorney, Agent, or Firm* — George R. MCGuire; Bond Schoeneck & King PLLC

(57) ABSTRACT

The invention concerns a reflow soldering machine for continuously soldering of soldering goods in a process channel along a process direction, whereby the process channel comprises at least one pre-heating zone, at least one soldering zone, and at least one cooling zone, whereby the soldering zone comprises a pressure chamber comprising one base part and one cover part opposite the base part and that can be raised when the reflow soldering machine is operating, wherein the process channel can be covered by at least one covering hood that can be opened, and wherein the cover part is motion-coupled to the covering hood in such a way that when the covering hood is opened, the cover part is also taken along by the covering hood.

12 Claims, 3 Drawing Sheets

(58) Field of Classification Search
CPC .......... B23K 1/015; B23K 1/008; B23K 3/00;
B23K 3/04; B23K 3/08; B23K 3/085;
B23K 2101/36; B23K 2101/38
See application file for complete search history.

(56) References Cited

U.S. PATENT DOCUMENTS

| | | | |
|---|---|---|---|
| 2009/0236402 A1* | 9/2009 | Willenegger | B23K 1/08 |
| | | | 228/45 |
| 2021/0069810 A1* | 3/2021 | Rehm | B23K 1/008 |
| 2023/0143981 A1* | 5/2023 | Hofmann | B23K 37/04 |
| | | | 228/47.1 |
| 2023/0147071 A1* | 5/2023 | Endreß | B23K 1/0016 |
| | | | 228/6.2 |

FOREIGN PATENT DOCUMENTS

| | | |
|---|---|---|
| DE | 112006000682 T5 | 3/2008 |
| DE | 102007005345 A1 | 8/2008 |
| DE | 102009028865 B4 | 3/2011 |
| EP | 3482861 A1 | 5/2019 |

OTHER PUBLICATIONS

International Search Report and Written Opinion, PCT/EP2020/074018. Mailing date of Search Report Dec. 2, 202. pp. 1-7.
International Preliminary Report on Patentability, dated May 27, 2021. pp. 1-28.
Complement to First Office Action of German Application 10 2019 125 983.5, pp. 1-4.

* cited by examiner

REFLOW SOLDERING MACHINE FOR CONTINUOUSLY SOLDERING OF SOLDERING GOODS

CROSS REFERENCE TO RELATED APPLICATIONS

This is a National Stage Application filed under 35 U.S.C. 371 based on International Patent Application NoPCT/EP2020/074018, filed on Aug. 27, 2020, which claims priority to German Patent Application 10 2019 125 983.5 filed Sep. 26, 2019. The entire disclosures of each of the foregoing are hereby incorporated herein by reference in their entireties.

BACKGROUND

The invention concerns a reflow soldering machine for continuously soldering of soldering goods in a process channel along a process direction, whereby the process channel comprises at least one pre-heating zone, at least one soldering zone, and at least one cooling zone, whereby the soldering zone comprises a pressure chamber comprising one base part and one cover part opposite the base part and that can be raised when the reflow soldering machine is operational. The pressure chamber is a decompression chamber specifically, but a hyperbaric chamber is also possible.

Such reflow soldering machines are used to solder SMD (surface-mounted devices) components onto the surface of conductor plates via soldering paste. The soldering paste, in particular a mixture of soldering metal granualte, flow medium, and paste-like components, is applied or printed onto the surface of the conductor plates for reflow soldering. The components to be soldered are then placed into the soldering paste. In the reflow soldering process, the soldering goods, the assembly consisting of the conductor plate, soldering paste, and components to be soldered, is pre-heated along the process channel in the pre-heating zone and then, in the soldering zone, heated up to a temperature above the melting point of the soldering paste. The soldering paste thus melts and the solder points form. The soldering goods are cooled in the cooling zone until the melted substance hardens and are taken out of the reflow soldering machine.

In reflow soldering machines, the process channel is covered by a covering hood in order to provide the desired temperature profile and a defined atmosphere in the process channel. Furthermore, process gases form in the process channel that can be diverted from the process channel and purified. Depending on the length of the process channel, one, two, three, or more covering hoods can be provided. The covering hoods can be gas-tight and adjusted lengthwise to the size of the respective machine.

In order to achieve a better process result, it is possible to provide a decompression chamber or vacuum chamber in the soldering zone and to configure it such that the soldering process in the vacuum chamber utilizes decompression well below the atmospheric pressure. This causes the removal of gas- and air bubbles, flow medium residue and other impurities by the decompression during the soldering process, thereby increasing the quality of the solder connections. The quality of the solder connections can also be improved by using a hyperbaric chamber, within which the soldering process occurs.

DE 10 2009 028 865 B4 and US 2009/0014503 A1 describe reflow soldering machines with vacuum chambers. DE 201 02 064 U1 and DE 199 11 887 C1 describe reflow soldering machines with a vacuum chamber comprising a base part and a rising cover part opposite the base part in the shape of a bell jar. The cover part can be raised from the base part for inserting and removing the soldering goods into and from the vacuum chamber.

EP 3 482 861 A1 describes another reflow soldering machine with a vacuum chamber, comprising a lid with a cover that can be lowered onto a base part and which forms a vacuum chamber with the base part.

SUMMARY OF THE INVENTION

The invention aims to provide a reflow soldering machine in which the pressure chamber can be easily opened and process-safe closeable and accessed, in particular for visual inspection, cleaning, and maintenance of the pressure chamber, as well as the transport aids within the pressure chamber, including the respective sensors.

This is achieved by a reflow soldering machine. In particular it is provided, that the process channel can be covered by at least one covering hood that can be opened, and that the cover part is motion-coupled to the covering hood in such a way that when the covering hood is opened, the cover part is also taken along by the covering hood, whereby the pressure chamber is opened. The design is such that, when the covering hood is opened, the cover part is lifted from the base part and opened wide such that visual inspection is possible and a operator has free access to the pressure chamber. The invention also has the advantage that only one component, the covering hood, must be opened in order to also open the pressure chamber. The cover part has no direct mechanical connection with the base part or a bottom part of the machine. With just one operation, the opening of the covering hood, the pressure chamber can be accessed. This makes operation easier and reduces maintenance and set-up time. With a relatively simple embodiment, the cover part can be directly placed on the covering hood and, for example, screwed on with fastening screws.

The covering hood is positioned to pivot open and closed on a pivot axis extending parallel to the process direction. When the covering hood swings open on the pivot axis, the cover part also swings open. The covering hood can only swing open when the cover part is in a service position or has been moved to such a position. This prevents damage to the cover part when it swings open.

In order to ensure a sufficient opening of the cover part when the covering hood swings open from the base part, there is a distance a between the pivot axis and a side of the base part facing the pivot axis. The distance a is preferably greater than zero and is in a range between 5 and 35 cm, ideally between 10 and 25 cm.

The base part comprises an interchangeable transport unit for moving the soldering goods through the chamber, and if the distance a is chosen so that the transport unit can be removed from the base part in the vertically upward direction when the covering hood is open. This allows for the simple installation or removal of the entire transport unit onto or from the base part when the covering hood is open. This may be done within relatively short set-up times in the event of a repair. In particular, it may be possible for just the upper unit of the transport unit that has contact with the conductor plates to be removed. If necessary, a base unit of the transport unit or the entire transport unit can be removed in a second step. Preferably, the removal is at least partially done without tools.

This task is likewise achieved by a reflow soldering machine. In particular it is provided, that the arrangement is such that there is a hoist mechanism provided on the covering hood, with which the cover part can be raised during operation of the reflow soldering machine for insertion and removal of the soldering goods into and from the pressure chamber, and lowered to for closing the pressure chamber. When the reflow soldering machine is in operation and the covering hood is closed, the cover part is raised via the hoist mechanism so that the soldering goods can be inserted into the pressure chamber. The cover part is then lowered to close the pressure chamber and subsequently pressurise the pressure chamber with a vacuum. The arrangement of the hoist mechanism on the covering hood is thus beneficial, because below the soldering goods is a transport system for moving the soldering goods through the process channel. There are structural benefits to the spatial separation of the transport system below the soldering goods and the hoist mechanism above the soldering goods on the covering hood; in particular there is more space for the hoist mechanism, as it does not physically depend on the transport system. There is also no need for mechanical guides at the conductor plate level that can have a negative impact on the temperature profile during soldering. The hoist mechanism and respective guides are above the cover part and have no influence on the soldering process. The arrangement of the cover part on the covering hood facilitates a much larger opening, thereby improving access for maintenance, cleaning, and service.

The hoist mechanism can in particular comprise cylinder-piston units, wherein the cylinders are provided in the covering hood or at least in sections on the outside of the covering hood and wherein the pistons extend at least in sections through the covering hood towards the cover part. Such an arrangement can be relatively compact. The cylinder-piston units can be designed as drives, with which quick and functionally precise lifting is facilitated via corresponding pressurization of the respective cylinder chambers. Furthermore, the cylinder-piston units or their piston rods can solely serve as a guide, while the actual hoisting motion is, for example, facilitated by a ball screw in conjunction with an electrical motor.

It is beneficial if the cover part is mounted to the covering hood the vertical direction in such a way that, when the pressure chamber is closed, the cover part comes to rest on the base part due to its own weight. A seal can be positioned between the cover part and base part for this purpose. This allows for stable positioning of the cover part on the base part. The covering hood and cover part can be moved independently of one another. During the soldering process, when the pressure chamber is pressurized with a vacuum, the cover part is closed against the base part due to the vacuum. The hoist mechanism, after the cover part has come to rest on the base part, it is moved into a release position and the pressure chamber is subjected to negative pressure, so that a relative movement of the cover part in the vertical direction is enabled and the associated elastic deformation of the chamber seal. This prevents the hoist unit from being strained by the force resulting from the pressure difference.

In order to ensure precise positioning of the cover part on the base part, it is beneficial if there are guide slants on the cover part and/or base part so that the cover part is horizontally positioned when closing onto the base part. The guide slants also allow for the cover part to independently find the precise alignment with the base part so that, when the pressure chamber is pressurized with a vacuum, the cover part is precisely, and thus tightly, positioned on the base part.

The covering hood is preferably shaped such that it extends in the process direction across at least the soldering zone, pre-heating zone, and/or cooling zone. Ideally the reflow soldering machine described by the invention can comprise two or three covering hoods, whereby the cover part is connected with the covering hood that covers the soldering zone, within which is the pressure chamber.

It is also beneficial if the pressure chamber contains heating elements on the cover part and/or on the base part, with which the soldering goods is heated during the pressurization of the pressure chamber with a vacuum. In particular, infrared or medium-wave radiators can be positioned inside the cover part that heat the soldering goods via heat radiation. The radiators are preferably positioned within the pressure chamber or on the moveable cover part. The radiators as such can be provided in quartz glass tubes for vacuum sealing during the reflow soldering process.

It is also beneficial if the exterior of the cover part and/or exterior of the base part comprise heating elements with which the cover part and/or base part, and thus also the pressure chamber, are heated. Such heating elements can in particular be unit heaters, flat heaters, or tube heaters. This type of pressure chamber heating facilitates considerable access in the event of a service or maintenance case.

BRIEF DESCRIPTION OF THE DRAWINGS

Further details and beneficial configurations of the invention can be found in the following description, with which one variant of the invention is further described and explained.

Showing.

DETAILED DESCRIPTION

Figure 1:
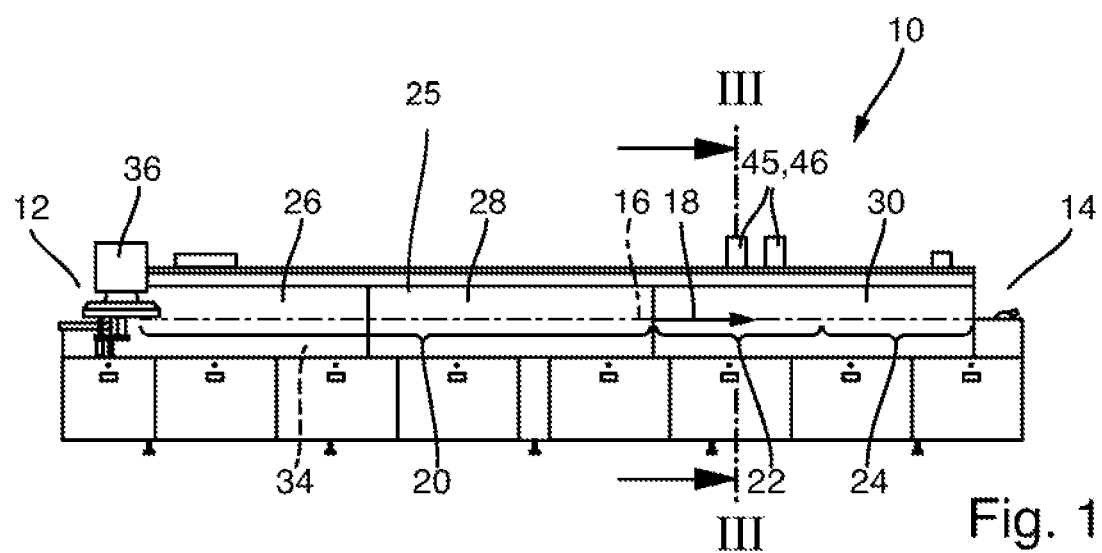
FIG. 1 reflow soldering machine, side view.

FIG. 1 shows a reflow soldering machine (10) for continuously soldering of soldering goods. The reflow soldering machine (10) comprises an entrance (12) and an exit (14), whereby the soldering goods to be soldered enter the reflow soldering machine (10) via the entrance (12) and exits the reflow soldering machine (10) via the exit (14). The soldering goods are moved along a process direction (18) of a process channel (16) shown in FIG. 1, which passes through the reflow soldering machine (10).

The process channel (16) comprises a pre-heating zone (20), a soldering zone (22), and a cooling zone (24). The reflow soldering machine (10) shown in FIG. 1 comprises a covering hood (25) with three segments (26, 28, 30) to cover the process channel (16).

Figure 2:
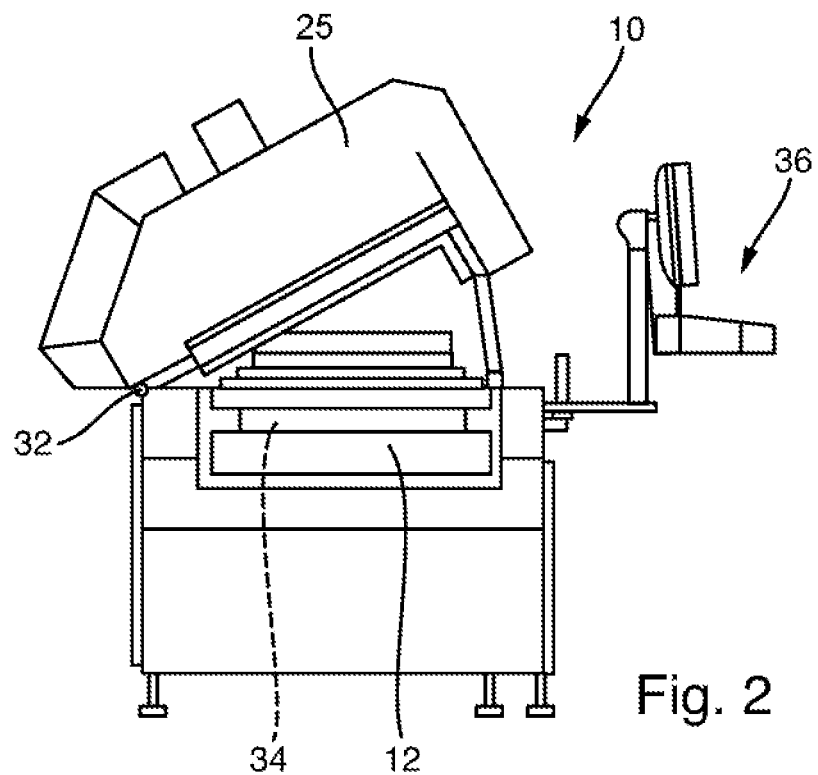
FIG. 2 reflow soldering machine as per FIG. 1, front view.

As shown in FIGS. 1 and 2, a communication unit (36) with a screen and an input device is provided, via which a machine control system can communicate with the reflow soldering machine (10).

The soldering goods, namely the conductor plates coated with soldering paste and equipped with electronic components, is first heated in the pre-heating zone (20) to a temperature below the melting point of the soldering paste. In the soldering zone (22), the conductor plate is heated for a certain amount of time up to a process temperature above the melting point of the soldering paste, so that it melts in the soldering zone, in order to solder the electronic components with the conductor plate. In the cooling zone (24) the soldering goods are cooled so that the liquid solder solidifies before the soldering goods are being extracted at the exit (14) of the reflow soldering machine (10).

Figure 5:
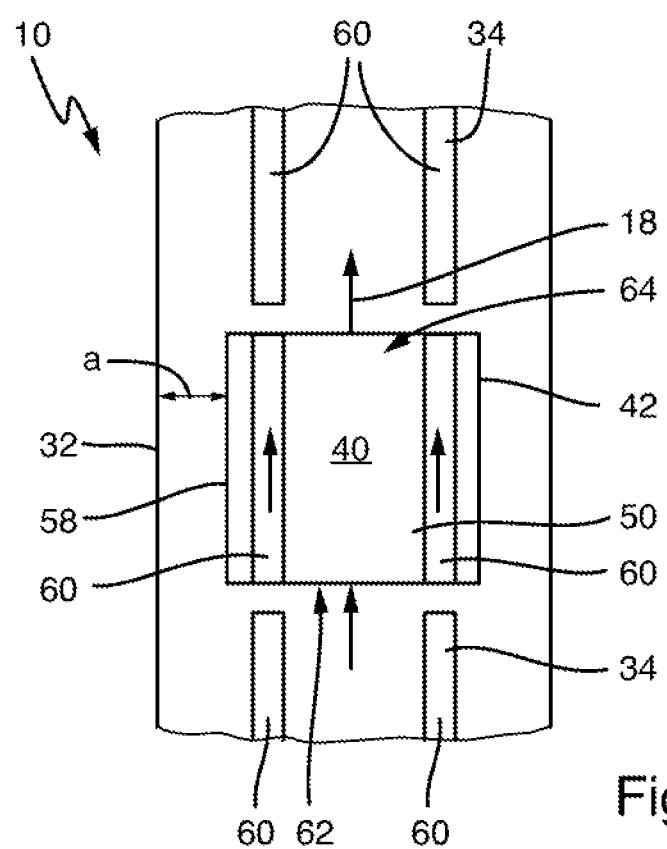
FIG. 5 top view of soldering zone of reflow soldering machine without covering hood.

In order to move the soldering goods along the process direction (18), there is a transport system (34) within the reflow soldering machine (10), which is indicated in FIG. 5 but not further described herein.

As shown by the front view of FIG. 2, the covering hood (25) can be swung open around a pivot axis (32) arranged parallel to the process direction (18). When the covering hood (25) is swung open, the transport system (34) is accessible for visual inspection, maintenance, cleaning, installation, and repair. The covering hood is normally not opened during operation of the reflow soldering machine (10). Rather, the covering hood (25) is closed during the soldering process in order to facilitate a defined temperature profile along the process direction within the reflow soldering machine (10). The covering hood (25) also facilitates the formation of an enclosed atmosphere within the reflow soldering machine (10), whereby any generated process gases can be extracted and purified.

Figure 3:
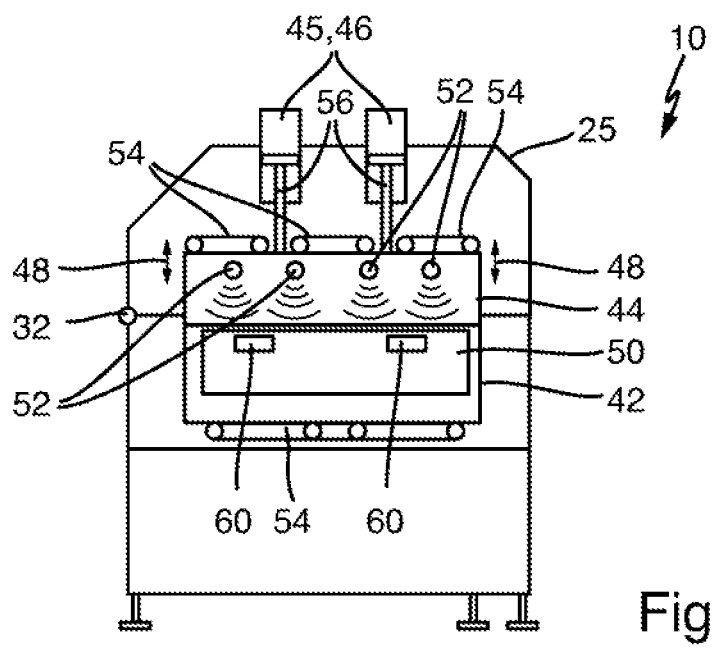
FIG. 3 a cut along line III through the reflow soldering machine as per FIG. 1.
Figure 4:
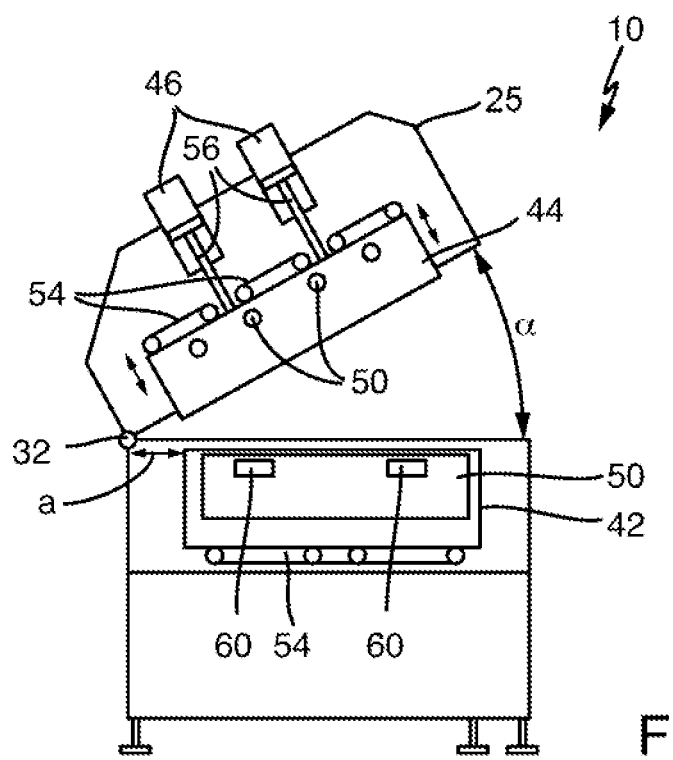
FIG. 4 cut as per FIG. 3 with open covering hood.

As shown in the cuts as per FIGS. 3 and 4, and the top view from FIG. 5, there is a pressure chamber in the soldering zone (22) in the form of a decompression chamber (40), formed by a base part (42) and a cover part (44). The cover part (44) is arranged on the covering hood (25) via a hoist mechanism (45). Because the cover part (44) is arranged on the cover hood (25), as shown in FIG. 4, when the cover hood (25) is opened, i.e. when the cover hood (25) is pivoted around the pivot axis (32), the cover part (44) is lifted off the base part (42) and the vacuum chamber (40) is also opened.

The cover part (44) can be lifted vertically from the base part (42) along the arrows (48) via the hoist mechanism (45), comprising two cylinder-piston units (46), when the reflow soldering machine (10) is operational. When the soldering system is operational, the cover part (44) must be lifted in order to let the soldering goods pass into the decompression chamber (40). Once the soldering goods is in the decompression chamber (40), the cover part (44) is lowered via the hoist mechanism (45) and brought to rest on the base part (42). In a subsequent step, a vacuum pump (not pictured) is used to evacuate the decompression chamber (40) so that there is a sufficient vacuum in the decompression chamber (40). The decompression expels air trapped in the liquid solder. After briefly applying a vacuum to the decompression chamber (40), the cover part (44) is lifted via a corresponding actuation of the hoist mechanism (45) or cylinder-piston units (46), so that the soldering goods can exit the decompression chamber (40). Ideally the soldering goods move at a constant or changing speed through the decompression chamber (40) during the process described here. The decompression chamber (40) contains a transport unit (50) for this purpose that takes on the soldering goods upon entry into the decompression chamber (40), guides it through the decompression chamber (40), and transfers it to the transport system (34) outside the decompression chamber (40) upon exiting the decompression chamber (40).

The cylinder-piston units (46) each comprise a cylinder that is firmly attached to the covering hood (25). Within the respective cylinder is a piston with a piston rod (56), which extends to the cover part (44) and is firmly connected to the cover part (44). The arrangement is preferably such that, when the cover part (44) is lowered, it comes to rest on the base part (42) due to its dead weight. In order to ensure precise positioning, the cover part (44) and/or base part (42) ideally comprise guide slants that cause the cover part (44) to rest on the base part (42) in the specified position when the cover part (44) is lowered. The cover part (44) can hover on the horizontal level so that the cover part (44) independently finds its specified position on the base part (42) when lowering. In order to achieve a secure seal of the decompression chamber (40), it is preferable if there is a suitable seal (not pictured) between the cover part (44) and the base part (42). After the cover part (44) comes to rest, the cover part (44) or hoist device (45) preferably move into a release position so that a relative vertical movement of the cover part (44) during the reduction of pressure in the decompression chamber (40) and resulting elastic deformation of the chamber seal is enabled.

As shown in FIGS. 3 and 4, there are multiple heating elements (52) within the decompression chamber (40), specifically on the interior of the cover part (44), in particular in the form of infrared or medium-wave heat radiators, that heat the soldering goods via heat radiation during operation of the reflow soldering machine (10). Furthermore, there are heating elements (54) outside of the cover part (44) in the form of flat heaters or tube heaters, which heat the cover part (44) during operation of the reflow soldering machine, in order to generate a corresponding temperature within the decompression chamber (40). Furthermore, there are heating elements (54) on the exterior of the base part, in particular in the form of flat heaters or tube heaters, in order to heat the base part (42) accordingly.

The transport unit (50) in the base part (42), with which the soldering goods can be moved within the decompression chamber, is preferably interchangeably positioned in the base part (42). The transport unit (50) is replaced with the covering hood (25) opened and the cover part (44) opened. In order to provide enough free space to replace the transport unit (50), the distance a between the pivot axis (32) and the side (58) of the base part (42) facing the pivot axis (32), and the swinging angle α around which the covering hood (25) can swing open, must both be so large that, when the covering hood (25) is swung open, the transport unit (50) can be vertically removed above from the base part from the side of the reflow soldering machine (10).

In the top view as per FIG. 5, the base part (42) and the transport unit (50) within the base part (42) can be seen. There are a total of two parallel paths (60), along which soldering goods can be moved adjacent to one another in the process direction (18) through the process chamber (16) and decompression chamber (40). The decompression chamber (40) comprises a chamber entrance (62) in which soldering goods coming from the transport system (34) can be transferred to the transport system (50), and a chamber exit (64) in which the soldering goods is returned to the transport system (34).

The advantage of the reflow soldering machine (10) described herein is that, when opening the covering hood (25) the cover part (44) opens as well. There is thus no need for a separate process or mechanism to open the cover part (44). Furthermore, it is particularly advantageous that the cover part (44) can be lifted and lowered via the hoist mechanism (45) during operation of the reflow soldering machine (10) to open and close the vacuum chamber (40).

The invention claimed is:

1. Reflow soldering machine for continuously soldering of goods in a process channel along a process direction, whereby the process channel comprises at least one preheating zone, at least one soldering zone, and at least one cooling zone, whereby the soldering zone comprises a pressure chamber comprising a base part and a cover part opposite to the base part that can be raised when the reflow soldering machine is operating, whereby the process channel can be covered by at least one covering hood that can be opened, and whereby the cover part is motion-coupled to the covering hood in such a way that when the covering hood is opened, the cover part is also taken along by the covering hood, whereby the covering hood is positioned to pivot open and closed on a pivot axis extending parallel to the process direction, whereby there is a distance a between the pivot axis and a side of the base part facing the pivot axis, characterized in that in the base part an interchangeable transport unit for moving the soldering goods through the pressure chamber is provided, and that the distance a is chosen large enough, in that the transport unit can be removed from the base part in the vertically upward direction when the cover hood is open.

2. Reflow soldering machine as per claim 1, characterized in that guide slants are provided at the cover part and/or at the base part, so that the cover part is aligned in horizontal direction towards the base part when the pressure chamber is closed.

3. Reflow soldering machine as per claim 1, characterized in that the covering hood extends in the process direction across at least the pre-heating zone, the soldering zone, and/or the cooling zone.

4. Reflow soldering machine as per claim 1, characterized in that there are heating elements provided within the pressure chamber on the cover part and/or on the base part.

5. Reflow soldering machine as per claim 1, characterized in that there are heating elements provided on the exterior of the cover part and/or on the exterior of the base part.

6. Reflow soldering machine for continuously soldering of soldering goods in a process channel along a process direction, whereby the process channel comprises at least one pre-heating zone, at least one soldering zone, and at least one cooling zone, whereby the soldering zone comprises a pressure chamber comprising a base part and a cover part opposite the base part that can be raised when the reflow soldering machine is operating, whereby the process channel can be covered by at least one covering hood that can be opened, and whereby the cover part is motion-coupled to the covering hood in such a way that when the covering hood is opened, the cover part is also taken along by the covering hood, whereby a hoist mechanism is provided at the covering hood, by which the cover part can be raised when the covering hood is in the closed position for moving the soldering material in and out and can be lowered for closing the pressure chamber, characterized in that the cover part is mounted to the cover hood in the vertical direction in such a way that, when the pressure chamber is closed, the cover part comes to rest on the base part due to its own weight, and in that the hoist mechanism is configured in such a way that, after the cover part has come to rest on the base part, it is moved into a release position and the pressure chamber is subjected to negative pressure, so that a relative movement of the cover part in the vertical direction is enabled.

7. Reflow soldering machine as per claim 6, characterized in that the hoist mechanism comprises cylinder-piston units, wherein the cylinders are provided in the covering hood or at least in sections on the outside of the covering hood and wherein the pistons extend at least in sections through the covering hood towards the cover part.

8. Reflow soldering machine as per claim 6, characterized in that guide slants are provided at the cover part and/or at the base part, so that the cover part is aligned in horizontal direction towards the base part when the pressure chamber is closed.

9. Reflow soldering machine as per claim 6, characterized in that the covering hood extends in the process direction across at least the pre-heating zone, the soldering zone, and/or the cooling zone.

10. Reflow soldering machine as per claim 6, characterized in that there are heating elements provided within the pressure chamber on the cover part and/or on the base part.

11. Reflow soldering machine as per claim 6, characterized in that there are heating elements provided on the exterior of the cover part and/or on the exterior of the base part.

12. Reflow soldering machine for continuously soldering goods in a process channel along a process direction, the process channel comprises at least one pre-heating zone, at least one soldering zone, and at least one cooling zone,
a, wherein the soldering zone comprises a pressure chamber comprising a base part and a cover part opposite to the base part that can be raised when the reflow soldering machine is operating,
b, wherein the process channel can be covered by at least one covering hood that can be opened,
c, wherein the cover part is motion-coupled to the covering hood in such a way that when the covering hood is opened, the cover part is also taken along by the covering hood,
d, wherein the covering hood is positioned to pivot open and closed on a pivot axis extending parallel to the process direction,
e, wherein there is a distance a between the pivot axis and a side of the base part facing the pivot axis,
f. characterized in
g. that in the base part an interchangeable transport unit for moving the soldering goods through the pressure chamber is provided,
h, wherein the distance a is chosen large enough, in that the transport unit can be removed from the base part in the vertically upward direction when the cover hood is open,
i, wherein a hoist mechanism is provided at the covering hood, by which the cover part can be raised when the covering hood is in the closed position for moving the soldering material in and out and can be lowered for closing the pressure chamber, and
j, wherein the cover part is mounted to the cover hood in the vertical direction in such a way that, when the pressure chamber is closed, the cover part comes to rest on the base part due to its own weight, and in that the hoist mechanism is configured in such a way that, after the cover part has come to rest on the base part, it is moved into a release position and the pressure chamber.

* * * * *